(12) United States Patent
Kunugi et al.

(10) Patent No.: US 8,981,775 B2
(45) Date of Patent: Mar. 17, 2015

(54) MAGNETIC RESONANCE IMAGING APPARATUS AND GRADIENT MAGNETIC FIELD APPLICATION METHOD

(75) Inventors: Yoshiyuki Kunugi, Tokyo (JP); Takashi Nishihara, Tokyo (JP)

(73) Assignee: Hitachi Medical Corporation, Tokyo (JP)

( * ) Notice: Subject to any disclaimer, the term of this patent is extended or adjusted under 35 U.S.C. 154(b) by 437 days.

(21) Appl. No.: 13/393,319

(22) PCT Filed: Sep. 10, 2010

(86) PCT No.: PCT/JP2010/065622
§ 371 (c)(1),
(2), (4) Date: Feb. 29, 2012

(87) PCT Pub. No.: WO2011/034004
PCT Pub. Date: Mar. 24, 2011

(65) Prior Publication Data
US 2012/0169339 A1    Jul. 5, 2012

(30) Foreign Application Priority Data
Sep. 17, 2009    (JP) .................. 2009-215621

(51) Int. Cl.
*G01V 3/00*    (2006.01)
*G01R 33/565*    (2006.01)

(52) U.S. Cl.
CPC .................. *G01R 33/56509* (2013.01)
USPC ........................................ 324/309

(58) Field of Classification Search
USPC ................................. 324/300–324
See application file for complete search history.

(56) References Cited

U.S. PATENT DOCUMENTS

| 4,290,019 | A | * | 9/1981 | Hutchison et al. | 324/311 |
| 5,853,365 | A | | 12/1998 | Yamagata | |
| 6,157,192 | A | * | 12/2000 | Cordes | 324/309 |
| 8,436,613 | B2 | * | 5/2013 | Feiweier | 324/309 |
| 2001/0010464 | A1 | | 8/2001 | Takamori et al. | |
| 2003/0191386 | A1 | | 10/2003 | Heid | |

FOREIGN PATENT DOCUMENTS

| JP | 6-86767 | 3/1994 |
| JP | 9-253068 | 9/1997 |
| JP | 2001-309902 | 11/2001 |
| JP | 2003-299633 | 10/2003 |
| JP | 2006-280820 | 10/2006 |

OTHER PUBLICATIONS

International Search Report in PCT/JP2010/065622.

* cited by examiner

*Primary Examiner* — Dixomara Vargas
(74) *Attorney, Agent, or Firm* — Cooper & Dunham LLP

(57) ABSTRACT

When it is difficult to apply a rephasing gradient magnetic field of a predetermined order according to an imaging parameter value set as input, a rephasing gradient magnetic field of a smaller amount of application is calculated, and at least some echo signals are measured using the calculated rephasing gradient magnetic field of the smaller amount of application.

18 Claims, 10 Drawing Sheets

(a)

(b)

(a)

PHASE ENCODING WAVEFORM OF LOW SPATIAL FREQUENCY COMPONENT

MAGNETIC RESONANCE IMAGING APPARATUS AND GRADIENT MAGNETIC FIELD APPLICATION METHOD

TECHNICAL FIELD

The present invention relates to a magnetic resonance imaging (hereinafter, referred to as an "MRI") apparatus and in particular, to a rephasing gradient magnetic field application method based on a GMN (Gradient Moment Nulling) method.

BACKGROUND ART

The MRI apparatus is an apparatus which measures an NMR signal generated by the object, especially, nuclear spins which form human tissue and images the shapes or functions of the head, abdomen, limbs, and the like in a two-dimensional manner or in a three-dimensional manner. In the imaging, different phase encoding and different frequency encoding are given to NMR signals by the gradient magnetic field, and the NMR signals are measured as time-series data. The measured NMR signals are reconstructed as an image by two-dimensional or three-dimensional Fourier transform.

In the above MRI apparatus, when a moving material or tissue in motion, such as blood, is present in the imaging region, the phase of the spins caused by the movement or motion is reconverged (rephased) without depending on the speed or acceleration of the movement or motion by the pulse sequence in which a rephasing gradient magnetic field based on the GMN method is added, so that the influence (that is, artifacts) on the image quality is eliminated or reduced (hereinafter, this is called a rephasing effect). This rephasing gradient magnetic field is applied in the form of first order or second order in at least one direction of a slice direction, a phase encoding direction, and a frequency encoding direction (for example, PTL 1).

CITATION LIST

Patent Literature

[PTL 1] JP-A-9-253068

SUMMARY OF INVENTION

Problems to be Solved

The range in which imaging parameters of an MRI apparatus can be set is restricted by the application timing or application strength of a gradient magnetic field in many cases. In particular, in the case of a pulse sequence using a rephasing gradient magnetic field, the number of gradient magnetic field pulses which form the rephasing gradient magnetic field, the application strength of the gradient magnetic field pulse, and the change rate (dB/dt) of the gradient magnetic field per unit time tend to increase with an increase in the order of rephasing. For this reason, imaging under the imaging parameter setting value that the operator wants, that is, under the desired imaging conditions becomes difficult, and this has increased the load on the hardware of the MRI apparatus or the object. It is thought that the same problem occurs also in the method of setting the rephasing gradient magnetic field in PTL 1.

Therefore, the present invention has been made in view of the above problem, and it is an object of the present invention to provide an MRI apparatus and a gradient magnetic field application method capable of obtaining the rephasing effect based on the GMN method while reducing the load on the hardware of the MRI apparatus and an object according to the imaging parameter setting value that an operator wants.

Means for Solving the Problems

In the present invention, in order to achieve the above-described object, when it is difficult to apply a rephasing gradient magnetic field of a predetermined order according to the imaging parameter value set as input, a rephasing gradient magnetic field of a smaller amount of application is calculated. Using the calculated rephasing gradient magnetic field of the smaller amount of application, at least some echo signals are measured.

Specifically, an MRI apparatus of the present invention includes: a gradient magnetic field generator which generates a gradient magnetic field; an arithmetic processing unit that calculates a rephasing gradient magnetic field based on a GMN method; a measurement control unit that controls measurement of echo signals from an object by applying the rephasing gradient magnetic field to the object; and an input/output unit that displays a value of an imaging parameter and also receives inputting and setting of the imaging parameter value, and is characterized in that the arithmetic processing unit calculates a rephasing gradient magnetic field of a smaller amount of application than a rephasing gradient magnetic field of a predetermined order according to the imaging parameter value set as input and the measurement control unit measures at least some echo signals using the rephasing gradient magnetic field of the smaller amount of application than the rephasing gradient magnetic field of the predetermined order.

In addition, a gradient magnetic field application method of the present invention is characterized in that it includes: an imaging condition setting step of receiving inputting and setting of a value of an imaging parameter; a rephasing gradient magnetic field calculation step of calculating a rephasing gradient magnetic field of a smaller amount of application than a rephasing gradient magnetic field of a predetermined order according to the imaging parameter value set as input; and a measurement step of measuring at least some echo signals using the rephasing gradient magnetic field of the smaller amount of application than the rephasing gradient magnetic field of the predetermined order.

Advantageous Effects of Invention

According to the MRI apparatus and the gradient magnetic field application method of the present invention, an image in which artifacts caused by the movement or flow are eliminated or reduced can be obtained by the rephasing effect based on the GMN method while reducing the load on the hardware of the MRI apparatus and the object according to the imaging parameter setting value that an operator wants.

MODES FOR CARRYING OUT THE INVENTION

Figure 1:
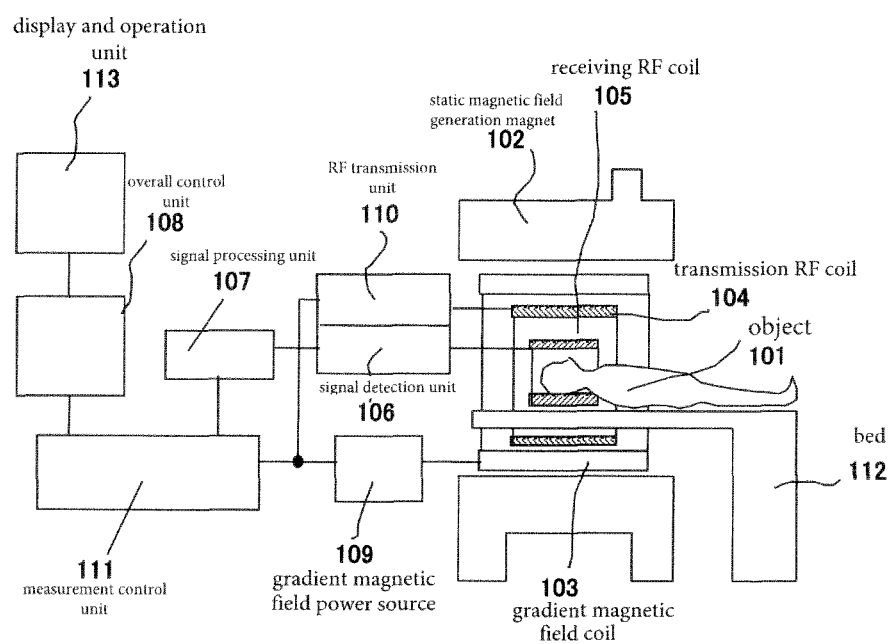
FIG. 1 is a block diagram showing the entire configuration of an example of an MRI apparatus related to the invention.

Hereinafter, preferred embodiments of an MRI apparatus of the present invention will be described in detail according to the accompanying drawings. In addition, in all drawings for explaining the embodiments of the present invention, the same reference numerals are given to those with the same functions and repeated explanation thereof will be omitted.

First, the outline of an example of an MRI apparatus related to the present invention will be described on the basis of FIG. 1. FIG. 1 is a block diagram showing the entire configuration of an example of the MRI apparatus related to the present invention. This MRI apparatus acquires a tomographic image of an object 101 using an NMR phenomenon. As shown in FIG. 1, the MRI apparatus is configured to include a static magnetic field generation magnet 102, a gradient magnetic field coil 103 and a gradient magnetic field power source 109, a transmission RF coil 104 and an RF transmission unit 110, a receiving RF coil 105 and a signal detection unit 106, a signal processing unit 107, a measurement control unit 111, an overall control unit 108, a display and operation unit 113, and a bed 112 on which the object 101 is carried and which takes the object 101 to the inside and outside of the static magnetic field generation magnet 102.

The static magnetic field generation magnet 102 generates a uniform static magnetic field in a direction perpendicular to the body axis of the object 101 in the case of a vertical magnetic field method and in the body axis direction in the case of a horizontal magnetic field method. A permanent magnet type, a normal conducting type, or a superconducting type static magnetic field generator is disposed around the object 101.

In addition, a shim coil or a shim member is disposed in the static magnetic field generation magnet 102 in order to correct a non-uniform static magnetic field.

The gradient magnetic field coil 103 is a coil wound in three axial directions of X, Y, and Z, which are the coordinate system (stationary coordinate system) of the MRI apparatus, and each gradient magnetic field coil is connected to the gradient magnetic field power source 109 which drives it so that a current is supplied thereto. The gradient magnetic field coil 103 and the gradient magnetic field power source 109 form a gradient magnetic field generator. Specifically, the gradient magnetic field power source 109 of each gradient magnetic field coil is driven according to a command from the measurement control unit 111, which will be described later, and supplies a current to each gradient magnetic field coil. Then, the gradient magnetic fields Gx, Gy, and Gz are generated in the three axial directions of X, Y, and Z. At the time of imaging, a slice selection gradient magnetic field pulse (Gs) is applied in a direction perpendicular to the slice surface (cross section of imaging) so that the slice surface of the object 101 is set, and a phase encoding gradient magnetic field pulse (Gp) and a frequency encoding gradient magnetic field pulse (Gf) are applied in the two remaining directions, which are perpendicular to the slice surface and are also perpendicular to each other, so that the positional information in each direction is encoded in an echo signal.

The transmission RF coil 104 is a coil which irradiates the object 101 with a high-frequency magnetic field (hereinafter, referred to as an RF) pulse, and is connected to the RF transmission unit 110 so that a high-frequency pulse current is supplied thereto. Then, nuclear magnetic resonance is induced in the nuclear spins of atoms which form body tissue of the object 101. Specifically, the RF transmission unit 110 is driven according to a command from the measurement control unit 111, which will be described later, to perform amplitude modulation of a high-frequency pulse. By supplying this amplified pulse to the transmission RF coil 104 disposed close to the object 101, the object 101 is irradiated with the RF pulse.

The receiving RF coil 105 is a coil which receives an echo signal (NMR signal) emitted by the NMR phenomenon of the nuclear spins which form body tissue of the object 101, and is connected to the signal detection unit 106 to transmit the received echo signal to the signal detection unit 106. The signal detection unit 106 performs detection processing of the echo signal received by the receiving RF coil 105. Specifically, an echo signal of the response of the object 101 induced by the RF pulse irradiated from the RF transmission coil 104 is received by the receiving RF coil 105 disposed close to the object 101. Then, the signal detection unit 106 amplifies the received echo signal according to the command from the measurement control unit 111 to be described later, divides it into two signals perpendicular to each other by rectangular phase detection, performs sampling of each signal by the predetermined number (for example, 128, 256, or 512), converts each sampling signal into the digital amount by A/D conversion, and transmits it to the signal processing unit 107 to be described later. Accordingly, the echo signal is acquired as time-series digital data (hereinafter, referred to as echo data) including a predetermined number of sampling data.

The signal processing unit 107 performs various kinds of processing on the echo data input from the signal detection unit 106, and transmits the processed echo data to the measurement control unit 111, which will be described later.

The measurement control unit 111 is a control unit that transmits various commands for echo data collection, which is necessary for reconstruction of a tomographic image of the object 101, mainly to the gradient magnetic field power source 109, the RF transmission unit 110, and the signal detection unit 106 in order to control them. Specifically, the measurement control unit 111 operates under the control of the overall control unit 108 to be described later, and controls the gradient magnetic field power source 109, the RF transmission unit 110, and the signal detection unit 106 on the basis of a certain predetermined pulse sequence to repeatedly execute the application of an RF pulse and a gradient magnetic field pulse to the object 101 and the detection of an echo signal from the object 101 and collects the echo data necessary for reconstruction of a tomographic image of the object 101.

The overall control unit 108 performs control of the measurement control unit 111 and control of various kinds of data processing and display, storage, and the like of the processing result, and is configured to include an arithmetic processing unit, which has a CPU and a memory inside, and a storage unit, such as an optical disc and a magnetic disk. Specifically, the overall control unit 108 controls the measurement control unit 111 to collect the echo data. Then, when the echo data is input from the signal processing unit 107, the arithmetic processing unit executes processing, such as signal processing and image reconstruction by Fourier transform, and displays a tomographic image of the object 101, which is the result, on the display and operation unit 113, which will be described later, and also records the tomographic image on the storage unit.

The display and operation unit (input/output unit) 113 includes a display for displaying the tomographic image of the object 101 and an operating section for inputting various kinds of control information of the MRI apparatus or the control information of processing performed by the overall control unit 108, such as a trackball, a mouse, and a keyboard. This operating section is disposed close to the display, so that the operator controls various kinds of processing of the MRI apparatus interactively through the operating section while observing the display.

Next, a specific example of a rephasing gradient magnetic field waveform and the calculation method will be described. First, a method of calculating second-order and first-order rephasing gradient magnetic field waveforms suitable for the slice direction and the frequency encoding direction will be described. Here, the first-order rephasing means being performed by the rephasing gradient magnetic field for re-converging the phase based on the velocity component, and the second-order rephasing means being performed by the rephasing gradient magnetic field for re-converging the phase based on the velocity and acceleration.

(Second-Order Rephasing Gradient Magnetic Field Waveform)

A method of calculating the application time and application strength of the second-order rephasing gradient magnetic field will be described below.

The position coordinate x(t) of the spins which perform accelerated motion is expressed as the following expression.

$$x(t) = x_0 + vt + \frac{1}{2}at^2 \quad (1)$$

Here, $x_0$, v, and a indicate a position at time t=0, a velocity, and acceleration, respectively. When a gradient magnetic field G(t) is applied, a magnetic field B(t) applied to the spins in motion is expressed as Expression (2).

$$B(t) = G(t) \cdot x(t) = G(t) \cdot x_0 + G(t) \cdot vt + \frac{1}{2}G(t) \cdot at^2 \quad (2)$$

Since the rotation speed ω(t) of the spins is proportional to the magnetic field applied to the spins at each time, the rotation speed ω(t) of the spins is expressed as Expression (3).

$$\omega(t) = \gamma \cdot G(t) \cdot x_0 + \gamma \cdot G(t) \cdot vt + \frac{1}{2}\gamma \cdot G(t) \cdot at^2 \quad (3)$$

Since the phase θ(t) of the spins at each time is a time integral of the rotation speed of the spins, the phase θ(t) of the spins is expressed as Expression (4).

$$\theta(t) = \int_0^\tau \omega(t)dt$$
$$= \gamma \int_0^\tau G(t)dt \cdot x_0 + \gamma \int_0^\tau G(t) \cdot tdt \cdot v + \frac{1}{2}\gamma \int_0^\tau G(t) \cdot t^2 dt \cdot a \quad (4)$$

Each time integral expressed in Expression (4) is called as follows.

(Zero-order moment)=$\int_0^\tau G(t)dt$ \quad (5-1)

(First-order moment)=$\int_0^\tau G(t) \cdot tdt$ \quad (5-2)

(Second-order moment)=$\int_0^\tau G(t) \cdot t^2 dt$ \quad (5-3)

As can be seen from Expression (4), at the timing at which all the moments become 0, all phases of the spins become 0 regardless of the initial position $x_0$ and the sizes of the velocity v and the acceleration a. That is, if a gradient magnetic field waveform in which all of these moments become 0 is calculated at the timing of echo time, phase components based on the movement or motion including the phase based on the accelerated motion can be corrected. Thus, the second-order rephasing can be realized.

Figure 2:
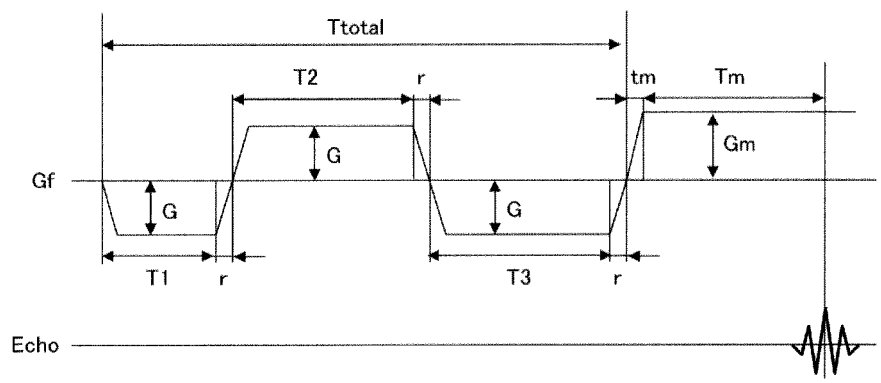
FIG. 2 is a timing chart showing an application pattern of the second-order rephasing gradient magnetic field in the frequency encoding direction.

In the case of performing second-order rephasing, it is general to apply three gradient magnetic field pulses in combination in each direction in addition to the slice selection gradient magnetic field or the frequency encoding gradient magnetic field, and it is necessary to designate the application time and application strength of each gradient magnetic field pulse. In the present invention, each application strength is set to the same value as an example. FIG. 2 shows an example of generating the rephasing gradient magnetic field in the frequency encoding direction (Gf) under the conditions in which the application strength of the gradient magnetic field is the same. The gradient magnetic field waveform shown in FIG. 2 is determined by four parameters G, T1, T2, and T3 shown in the drawing. On the other hand, each moment of the gradient magnetic field expressed in Expressions (5-1), (5-2), and (5-3) is also expressed as a function of these parameters. For this reason, a rephasing gradient magnetic field waveform which sets the moments of the three gradient magnetic fields to 0 simultaneously can be determined by solving three simultaneous equations with four variables.

A rising time of a gradient magnetic field with a strength G is expressed as r, strength and rising time of a frequency encoding gradient magnetic field are expressed as Gm and tm, respectively, and a signal read time is expressed as Tm. In this case, zero-order and first-order moments are expressed as follows, respectively.

$$\text{(Zero-order moment)} = -GT1 + GT2 - GT3 + Gm\left(Tm + \frac{1}{2}tm\right) \quad (6)$$

$$\text{(First-order moment)} = -\frac{1}{2}G(T^2 - r^2) + \quad (7)$$
$$\frac{1}{2}G(2T1 \cdot T2 + T2^2 + 3T2 \cdot r - 2T1 \cdot r - T2 \cdot r - 3r^2) -$$
$$\frac{1}{2}G\Big(2T1 \cdot T3 + 2T2 \cdot T3 + T3^2 + 5T3 \cdot r - 2T1 \cdot r - 2T2 \cdot r -$$
$$2T3 \cdot r - 5r^2\Big) + \left(\frac{5}{6}Gm \cdot tm - \frac{1}{2}G \cdot r\right)(T1 + T2 + T3 + 3r) +$$
$$\frac{1}{2}Gm(2T1 + 2T2 + 2T3 + 6r + 2tm + Tm)Tm$$

Simultaneous equations of Expressions (6) and (7) and Expression in which (second-order moment) is set to 0 are solved for the variables G, T1, T2, and T3. However, since the solution is not uniquely determined in this state, Expression (8) in which the sum of the application time of a gradient magnetic field is fixed is added to the simultaneous equations. Here, the fixed value is expressed as a total application time Ttotal of the three rephasing gradient magnetic fields.

$$T1 + T2 + T3 = T\text{total} \quad (8)$$

From the above, simultaneous equations to be solved become as follows.

$$-GT1 + GT2 - GT3 + Gm\left(Tm + \frac{1}{2}tm\right) = 0 \quad (9\text{-}1)$$

$$-\frac{1}{2}G(T^2 - r^2) + \quad (9\text{-}2)$$
$$\frac{1}{2}G(2T1 \cdot T2 + T2^2 + 3T2 \cdot r - 2T1 \cdot r - T2 \cdot r - 3r^2) -$$
$$\frac{1}{2}G(2T1 \cdot T3 + 2T2 \cdot T3 + T3^2 + 5T3 \cdot r - 2T1 \cdot r - 2T2 \cdot r -$$
$$T3 \cdot r - 5r^2) + \left(\frac{5}{6}Gm \cdot tm - \frac{1}{2}G \cdot r\right)(T1 + T2 + T3 + 3r) +$$
$$\frac{1}{2}Gm(2T1 + 2T2 + 2T3 + 6r + 2tm + Tm)Tm = 0$$

$$T1 + T2 + T3 = T\text{total} \quad (9\text{-}3)$$

$$\text{(Second-order moment)} = 0 \quad (9\text{-}4)$$

G, T1, T2, and T3 are determined by solving these simultaneous equations. Expression (10) is obtained by solving Expression (9-1) for T1.

$$T1 = T2 - T3 + \frac{Gm}{G}Tm + \frac{1}{2}\frac{Gm}{G}tm \quad (10)$$

By substituting this result into Expression (9-2) and solving it for T3, Expression (11) is obtained.

$$T3 = \frac{1}{2T2 + 2r}\left(T2^2 + \left(\frac{Gm}{G}tm + 2\frac{Gm}{G}Tm + r\right) \cdot T2 + C\right) \quad (11)$$

Here, $$C = \frac{1}{2}\left(\frac{Gm}{G}\right)^2 tm \cdot Tm + \frac{1}{8}\left(\frac{Gm}{G}\right)^2 tm^2 + \frac{1}{2}\left(\frac{Gm}{G}\right)^2 Tm^2 + \frac{5}{4}\frac{Gm}{G}r \cdot tm +$$
$$\frac{1}{3}\frac{Gm}{G}tm^2 + \frac{1}{2}\frac{Gm}{G}Tm^2 + \frac{5}{2}\frac{Gm}{G}Tm \cdot r + \frac{Gm}{G}Tm \cdot tm$$

By substituting Expressions (10) and (11) into Expression (9-3), Expression (12) for determining the value of T2 can be obtained.

$$T2 = \frac{1}{2}\left(T\text{total} - 3r - tm - Tm - \frac{Gm}{G}Tm - \frac{Gm}{2G}tm\right) \quad (12)$$

T1 and T3 can be determined by substituting this result into Expressions (10) and (11). In addition, assuming that the slew rate m of a gradient magnetic field is fixed, the rising time is expressed as Expression (13).

$$r = \frac{G}{m} \quad (13)$$

In this case, Expression (13) is substituted into Expressions given for T1, T2, and T3.

Figure 3:
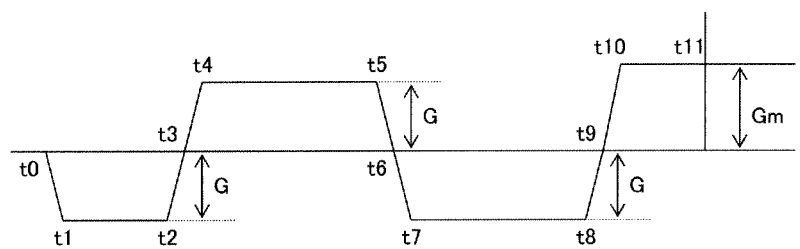
FIG. 3 is a timing chart showing a parameter used for moment calculation of the second-order rephasing gradient magnetic field waveform.

Here, if Expression (9-4) is expressed with a gradient magnetic field application pattern shown in FIG. 3, it can be written as Expression (14), and time t0 to t11 can be calculated by Expressions (15-1) to (15-12).

$$\int_{t0}^{t1} -m \cdot t^2(t-t0)dt + \int_{t1}^{t2} -G \cdot t^2 \cdot dt + \int_{t2}^{t3} m \cdot t^2(t-t3)dt +$$
$$\int_{t3}^{t4} m \cdot t^2(t-t3)dt + \int_{t4}^{t5} G \cdot t^2 \cdot dt + \int_{t5}^{t6} -m \cdot t^2(t-t6)dt +$$
$$\int_{t6}^{t7} -m \cdot t^2(t-t6)dt + \int_{t7}^{t8} -G \cdot t^2 \cdot dt + \int_{t8}^{t9} m \cdot t^2(t-t9)dt +$$
$$\int_{t9}^{t10} m \cdot t^2(t-t9)dt + \int_{t10}^{t11} Gm \cdot t^2 \cdot dt = 0 \quad (14)$$

$$t0 = 0 \quad (15\text{-}1)$$

$$t1 = r \quad (15\text{-}2)$$

$$t2 = T1 \quad (15\text{-}3)$$

$$t3 = t2 + r \quad (15\text{-}4)$$

$$t4 = t3 + r \quad (15\text{-}5)$$

$$t5 = t3 + T2 \quad (15\text{-}6)$$

$$t6 = t5 + r \quad (15\text{-}7)$$

$$t7 = t6 + r \quad (15\text{-}8)$$

$$t8 = t6 + T3 \quad (15\text{-}9)$$

$$t9 = t8 + r \quad (15\text{-}10)$$

$$t10 = t9 + tm \quad (15\text{-}11)$$

$$t11 = t10 + Tm \quad (15\text{-}12)$$

When T1, T2, and T3 obtained by Expressions (1) to (13) are substituted into Expression (14), the left side of Expression (14) showing the second-order moment becomes a function of only the strength G of a gradient magnetic field, and can be expressed as Expression (16).

$$\text{(Second-order moment)} = -m\left(\frac{t1^4 - t0^4}{4} - t0\frac{t1^3 - t0^3}{3}\right) - \quad (16)$$

$$G\frac{t2^3 - t1^3}{3} + m\left(\frac{t3^4 - t2^4}{4} - t3\frac{t3^3 - t2^3}{3}\right) +$$

$$m\left(\frac{t4^4 - t3^4}{4} - t3\frac{t4^3 - t3^3}{3}\right) + G\frac{t5^3 - t4^3}{3} +$$

$$m\left(\frac{t6^4 - t5^4}{4} - t6\frac{t6^3 - t5^3}{3}\right) - m\left(\frac{t7^4 - t6^4}{4} - t6\frac{t7^3 - t6^3}{3}\right) -$$

$$G\frac{t8^3 - t7^3}{3} + m\left(\frac{t9^4 - t8^4}{4} - t9\frac{t9^3 - t8^3}{3}\right) +$$

$$m\left(\frac{t10^4 - t9^4}{4} - t9\frac{t10^3 - t9^3}{3}\right) + Gm\frac{t11^3 - t10^3}{3}$$

The value of G is acquired by determining the zero point of this function numerically using the dichotomy. Through the above solution, the second-order rephasing gradient magnetic field waveform can be determined. In addition, although the conditions in which the application strength of the rephasing gradient magnetic field is fixed are set in the above calculation example, the application time and the application strength may be designated in the conditions in which the application time is fixed.

In addition, when the slew rate of a gradient magnetic field is not fixed, it is possible to calculate each rising time by using the value of each slew rate in Expression (13), and these values may be used for calculation.

If the value of Expression (16) converges to 0 by the dichotomy, the solution of the second-order rephasing gradient magnetic field waveform is found. This means that the found second-order rephasing gradient magnetic field waveform can be applied. However, the value of Expression (16) may diverge depending on the imaging conditions, and the solution may not be found. This means that a sufficient application time is not secured for a rephasing gradient magnetic field.

Moreover, in the calculation of a rephasing gradient magnetic field in the slice direction, the application pattern of the rephasing gradient magnetic field waveform is opposite in time to the application pattern in the frequency encoding direction. However, it is also possible to calculate the application time and application strength of each gradient magnetic field pulse by the same calculation.

(First-Order Rephasing Gradient Magnetic Field Waveform)

Next, a method of calculating the application time and application strength of the first-order rephasing gradient magnetic field will be described below. First, Expressions (1) to (5-2) are written as Expressions excluding the second-order components.

The position coordinate x(t) of the spins when a velocity component is considered is expressed as the following expression.

$$x(t) = x_0 + vt \quad (17)$$

Here, $x_0$ indicates a position at time t=0, and v indicates a velocity. When the gradient magnetic field G(t) is applied, the magnetic field B(t) applied to the spins in motion is expressed as Expression (18).

$$B(t) = G(t) \cdot x(t) = G(t) \cdot x_0 + G(t) \cdot vt \quad (18)$$

Since the rotation speed ω(t) of the spins is proportional to the magnetic field applied to the spins at each time, the rotation speed ω(t) of the spins is expressed as Expression (19).

$$\omega(t) = \gamma \cdot G(t) \cdot x_0 + \gamma \cdot G(t) \cdot vt \quad (19)$$

Since the phase θ(t) of the spins at each time is a time integral of the rotation speed of the spins, the phase θ(t) of the spins is expressed as Expression (20).

$$\theta(t) = \int_0^t \omega(t)dt = \gamma \int_0^t G(t)dt \cdot x_0 + \gamma \int_0^t G(t) \cdot t dt \cdot v \quad (20)$$

Each time integral expressed in Expression (20) is called as follows.

$$\text{(Zero-order moment)} = \int_0^t G(t) dt \quad (21\text{-}1)$$

$$\text{(First-order moment)} = \int_0^t G(t) \cdot t dt \quad (21\text{-}2)$$

Performing the first-order rephasing means applying a gradient magnetic field in which these moments become 0 to correct a phase component based on the speed of movement or motion. When generating a rephasing gradient magnetic field under the gradient magnetic field application pattern shown in FIG. 4, Expressions (21-1) and (21-2) can be expressed as follows.

$$G1 \cdot T1 + G2 \cdot T2 + Gm\left(Tm + \frac{tm}{2}\right) = 0 \quad (22\text{-}1)$$

$$\frac{1}{2}G1 \cdot T1(T1 + r1) - G2 \cdot T2(t1 + r1) - \quad (22\text{-}2)$$

$$\frac{1}{2}G2 \cdot T2(T2 + r2) + Gm\left(Tm + \frac{tm}{2}\right)(T1 + T2 + r1 + r2) +$$

$$\frac{1}{3}Gm \cdot tm^2 + gm \cdot Tm \cdot tm + \frac{1}{2}Gm \cdot Tm^2 = 0$$

Variables of these simultaneous equations are four variables of application times T1 and T2 and application strengths G1 and G2 which determine a rephasing gradient magnetic field waveform. Since there are four variables in two equations, it is not possible to determine uniquely a solution satisfying these equations. For this reason, the combination of the following conditions is added to solve the simultaneous equations.

$$T1 = T2 \quad (23\text{-}1)$$

$$T1 + T2 = T\text{total} \quad (23\text{-}2)$$

By eliminating G2 and T2 from Expression (22-2) using Expressions (22-1) and (23-1), the following expression is obtained.

$$G1 \cdot T1(T1 + r1) + \frac{1}{2}Gm\left(Tm + \frac{tm}{2}\right)(T1 + r2) + \quad (24)$$

$$\frac{1}{3}Gm \cdot tm^2 + Gm \cdot Tm \cdot tm + \frac{1}{2}Gm \cdot Tm^2 = 0$$

Here, the rising time r2 is expressed as the following Expression as in Expression (13).

$$r2 = \frac{G2}{m} \quad (25)$$

In addition, by substituting Expression (23-1) into Expression (22-1) and solving the result for G2, Expression (26) is obtained.

$$G2 = G1 + \frac{Gm}{T1}\left(Tm + \frac{tm}{2}\right) \quad (26)$$

By substituting this into Expression (25) and solving the result for r2, Expression (27) is obtained.

$$r2 = r1 + \frac{tm}{T1}\left(Tm + \frac{tm}{2}\right) \qquad (27)$$

By substituting this result into Expression (24) and solving the result for G1, Expression (28) is obtained.

$$G1 = \frac{1}{T1(T1+r1)}\left[\frac{1}{2}Gm\left(Tm + \frac{tm}{2}\right)\left\{T1 + r1 + \frac{tm}{T1}\left(Tm + \frac{tm}{2}\right)\right\} + \right.$$
$$\left. \frac{1}{3}Gm \cdot tm^2 + Gm \cdot Tm \cdot tm + \frac{1}{2}Gm \cdot Tm^2\right] \qquad (28)$$

From this result and the following expression, r1 can be calculated.

$$r1 = \frac{G1}{m} \qquad (29)$$

Through the above solution, the first-order rephasing gradient magnetic field waveform can be determined.

Similar to the case of second-order rephasing, the conditions regarding the application time of the rephasing gradient magnetic field are set in the above calculation example. However, the application time and the application strength may be designated in the conditions in which the application strength is fixed. Moreover, similar to the case of second-order rephasing, in the calculation of a rephasing gradient magnetic field in the slice direction, the application pattern of the rephasing gradient magnetic field waveform is opposite in time to the application pattern in the frequency encoding direction. However, it is also possible to calculate the application time and application strength of each gradient magnetic field pulse by the same calculation.

In addition, similar to the case of second-order rephasing, also when the slew rate of a gradient magnetic field is not fixed, it is possible to calculate each rising time by using the value of each slew rate in Expressions (25) and (29), and these values may be used for calculation.

In the above calculation examples of first-order rephasing and second-order rephasing, the gradient magnetic field strength or dB/dt may exceed the limit depending on the imaging conditions. In addition, the gradient magnetic field strength or dB/dt exceeds the limit easily in the high-order rephasing gradient magnetic field rather than the low-order rephasing gradient magnetic field. For example, the application strength or dB/dt for a gradient magnetic field calculated numerically by Expression (16) in the case of second-order rephasing, a gradient magnetic field calculated by Expressions (26) and (28) in the case of first-order rephasing, or a gradient magnetic field superimposed on a gradient magnetic field on the other axis in the case of oblique imaging may exceed the limit. This means that a sufficient application time is not secured for a rephasing gradient magnetic field. In such a case, it is not possible to apply the rephasing gradient magnetic field waveform of the order calculated. In one example of the present invention, the rephasing order or the like is lowered under the set imaging conditions in order to acquire the rephasing effect.

(Rephasing Gradient Magnetic Field Waveform in a Phase Encoding Direction)

Next, a method of calculating the application time and application strength of a rephasing gradient magnetic field applied in the phase encoding direction will be described below.

A phase $P_{stay}$ of the spins (hereinafter, referred to as stationary spin), which stands still at the arbitrary position x, at arbitrary time T is given by the following expression assuming that the applied gradient magnetic field is G(T) and center time of RF wave application is $T_{RF}$.

$$P_{stay}(x, T) = \int_{T_{RF}}^{T} x \cdot G(t)dt \qquad (30)$$

A phase of the spins (hereinafter, referred to as moving spins), which is moving in the phase encoding direction from the arbitrary position x with an arbitrary velocity v which is constant in a time direction, at arbitrary time T is given by the following expression.

$$P_{flow}(x, T) = \int_{T_{RF}}^{T} (x + vt) \cdot G(t)dt \qquad (31)$$

In order to correct a phase error caused by movement, phases of all spins should be the amount of phase encoding Ax to be added at the time of the center of a measured echo signal. For this reason, assuming that the time of the center of the measured echo signal is set to $T_{TE}$, the following expression should be satisfied.

$$\begin{cases} P_{stay}(x, T_{TE}) = \int_{T_{RF}}^{T_{TE}} x \cdot G(t)dt = Ax \\ P_{flow}(x, T_{TE}) = \int_{T_{RF}}^{T_{TE}} (x + vt) \cdot G(t)dt = Ax \end{cases} \qquad (32)$$

Since Expression (32) can be divided into the zero-order moment and the first-order moment, Expression (32) can be expressed as the following expressions.

$$\begin{cases} \text{zero - order moment} = \int_{T_{RF}}^{T_{TE}} x \cdot G(t)dt = Ax \\ \text{first - order moment} = \int_{T_{RF}}^{T_{TE}} vt \cdot G(t)dt = 0 \end{cases} \qquad (33)$$

Here, the position x and the velocity v are constant for t, they can be eliminated. Accordingly, the position x and the velocity v are expressed as the following expressions.

$$\begin{cases} \int_{T_{RF}}^{T_{TE}} G(t)dt = A \\ \int_{T_{RF}}^{T_{TE}} t \cdot G(t)dt = 0 \end{cases} \qquad (34)$$

Expression (34) is an expression that the gradient magnetic field should satisfy in rephasing in the phase encoding direction.

In the normal phase encoding gradient magnetic field, it is not possible to satisfy Expression (34). Accordingly, a gradient magnetic field application pattern shown in FIG. 5 will be considered. First, in Expressions (30) to (34), the following two are defined for the stationary spins and the moving spins.

The stationary spins and the moving spins are at the same position x at T=0.

At T=$T_{TE}$, the stationary spins and the moving spins have a phase corresponding to the amount of phase encoding at the position x In addition, although it is necessary to define the reference (time origin) of a time axis in Expressions (30) to (34), the following definition is given in the present invention.

$T_{TE}$ is set to T=0.

Accordingly, since the first-order moment depends on G (t), T1, T2, r, and T3, Expression (34) can be expressed as the following expression.

$$\begin{cases} G \cdot T1 + G \cdot T2 = A \\ G \cdot T1 \frac{2T3 + 2T2 + 3r + T1}{2} - G \cdot T2 \frac{2T3 + r + T2}{2} = 0 \end{cases} \quad (35)$$

Here, assuming that the sum of the application time of the gradient magnetic field when the rising time is neglected is Ta and the ratio of the application time of the gradient magnetic field is α, the application time of the gradient magnetic field can be expressed as the following expressions.

$$\begin{cases} T1 = \alpha \cdot Ta \\ T2 = (1-\alpha) \cdot Ta \end{cases} \quad (36)$$

If the relationship of Expression (36) is used, Expression (35) can be rewritten as the following expressions.

$$\begin{cases} G \cdot Ta(1-2\alpha) = A \\ 2Ta \cdot \alpha^2 - 4(T3 + 4 + Ta)\alpha + 2T3 + r + Ta = 0 \end{cases} \quad (37)$$

Since Expression (37) can be solved for G and α, Expression (37) can be expressed as following expressions.

$$\begin{cases} G = \frac{A}{Ta(1-\alpha)} \\ \alpha = \frac{T3 + r + Ta}{Ta}\left(1 - \sqrt{1 - \frac{Ta(2T3 + r + Ta)}{2(T3 + r + Ta)^2}}\right) \end{cases} \quad (38)$$

Figure 5:
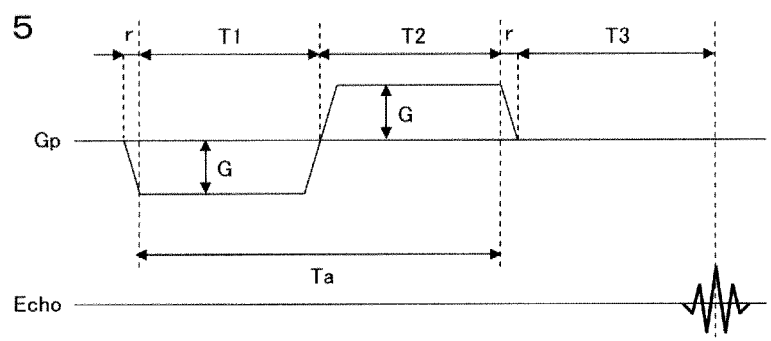
FIG. 5 is a timing chart showing an application pattern of the first-order rephasing gradient magnetic field on the phase encoding axis.

Since the strength and application time of a gradient magnetic field are determined from Expression (38), the application pattern in FIG. 5 can be determined by giving Ta, r, and T3.

Figure 6:
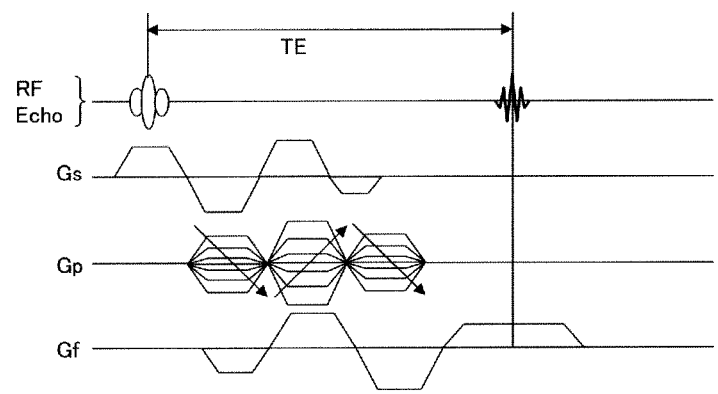
FIG. 6 is a pulse sequence diagram of 2D gradient echo in which the second-order rephasing gradient magnetic field is applied in each of the slice direction, the frequency encoding direction, and the phase encoding direction.

In the above calculation example, the case of calculating the first-order rephasing gradient magnetic field waveform applied in the phase encoding direction has been described in detail. However, the second-order rephasing gradient magnetic field waveform can be similarly calculated, and the timing chart when using the second-order rephasing gradient magnetic field in the phase encoding direction is shown in FIG. 6.

Moreover, depending on the imaging conditions, the application strength of the rephasing gradient magnetic field in the phase encoding direction calculated in Expression (38) or the application strength or dB/dt superimposed on a gradient magnetic field on the other axis in the case of oblique imaging may exceed the limit. This is because a sufficient application time is not secured for the rephasing gradient magnetic field or a gradient magnetic field applied in a direction other than the phase encoding direction is superimposed in the case of oblique imaging. In such a case, it is not possible to apply the rephasing gradient magnetic field waveform of the order calculated. In one example of the present invention, under the set imaging conditions, the rephasing order or the like is lowered or the range of phase encoding in which a rephasing gradient magnetic field is applied is set and no rephasing gradient magnetic field is applied outside this range, so that the possible rephasing effect is acquired.

In addition, although the example of generating the rephasing gradient magnetic field waveform including the phase encoding gradient magnetic field only in the phase encoding direction has been described in the above, a rephasing gradient magnetic field including a slice encoding gradient magnetic field may also be calculated similarly in the slice direction. In this case, it is preferable to set $T_{RF}$ to T0. A rephasing gradient magnetic field adapted for this slice encoding gradient magnetic field may be separately applied apart from the slice encoding gradient magnetic field or may be applied so as to be superimposed on the slice encoding gradient magnetic field. In the case of superimposing the rephasing gradient magnetic field on the slice encoding gradient magnetic field, it is necessary to pay attention to different moment calculation.

Figure 7:
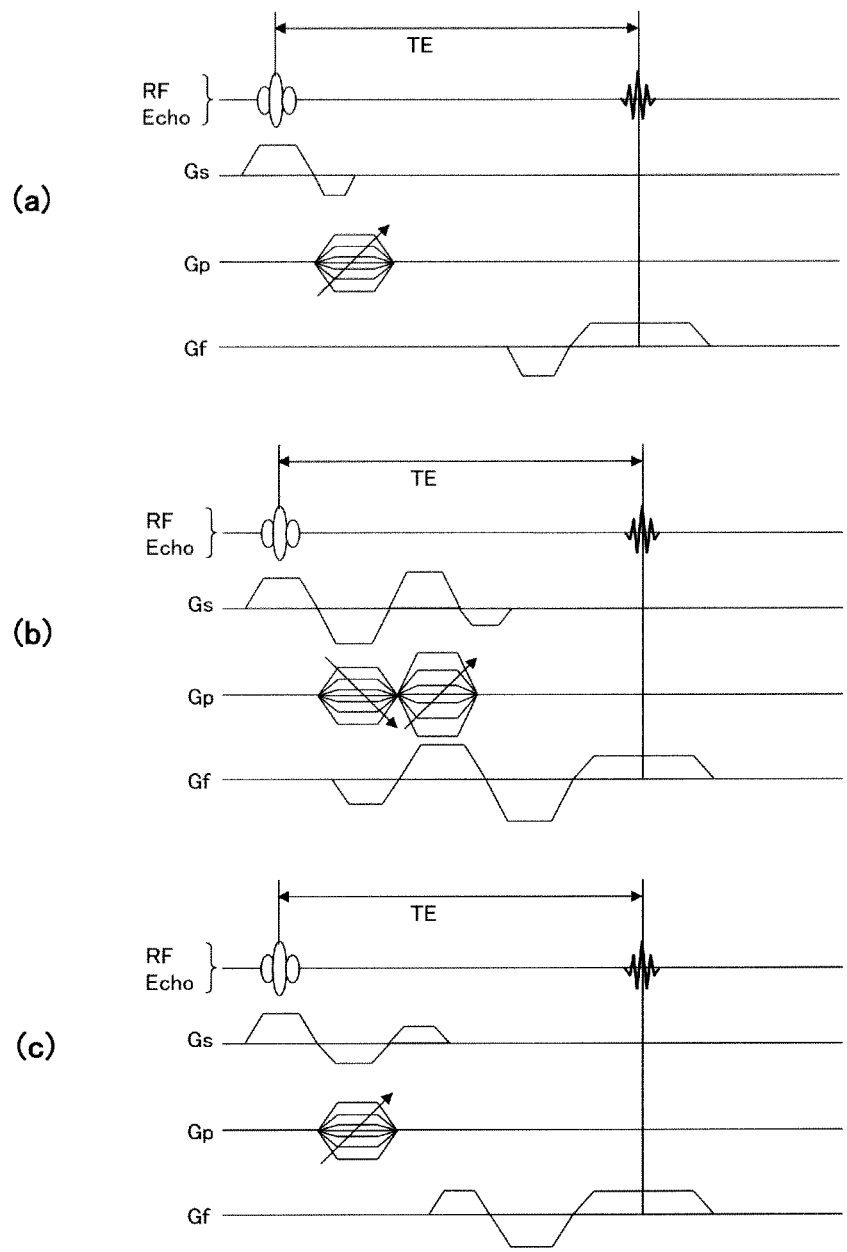
FIG. 7(a) is a pulse sequence diagram of 2D gradient echo in which the second-order rephasing gradient magnetic field is applied in the slice direction and the frequency encoding direction and the first-order rephasing gradient magnetic field is applied in the phase encoding direction.
FIG. 7(b) is a pulse sequence diagram of 2D gradient echo in which the first-order rephasing gradient magnetic field is applied in the slice direction and the frequency encoding direction.
FIG. 7(c) is a pulse sequence diagram of 2D gradient echo in which no rephasing gradient magnetic field is applied.

An example of the pulse sequence in which the rephasing gradient magnetic fields obtained in the above examples of calculating the second-order and first-order rephasing gradient magnetic field waveforms are added is shown in FIG. 7. FIG. 7(a) shows a basic pulse sequence of a 2D gradient echo method in which rephasing based on the GMN method is not performed in any of the three directions. Based on this basic pulse sequence, FIG. 7(b) shows a pulse sequence of a two-dimensional (2D) gradient echo method in which a rephasing gradient magnetic field which performs second-order rephasing is added in the slice direction and the frequency encoding direction and a rephasing gradient magnetic field which performs first-order rephasing is added in the phase encoding direction. FIG. 7(c) shows a pulse sequence of a 2D gradient echo method in which a rephasing gradient magnetic field which performs first-order rephasing is added in the slice direction and the frequency encoding direction and rephasing is not performed in the phase encoding direction.

Hereinafter, the present invention which controls the application of the rephasing gradient magnetic field in each direction described above will be described in detail. In the MRI apparatus and the gradient magnetic field application method of the present invention, a rephasing gradient magnetic field of a smaller amount of application than a rephasing gradient magnetic field of a predetermined order is calculated according to the imaging parameter value (that is, imaging conditions) set as input, and at least some echo signals are measured using the rephasing gradient magnetic field of the smaller amount of application than the rephasing gradient magnetic field of the predetermined order. In other words, when it is difficult to apply a high-order rephasing gradient magnetic field under the imaging conditions set as input, a rephasing gradient magnetic field of a low order is used or the phase encoding range where the rephasing gradient magnetic field is applied is selected. The direction in which such control of the application of the rephasing gradient magnetic field is performed is at least one direction of the slice direction, the frequency encoding direction, and the phase encoding direction. Hereinafter, each example will be described in detail in which at least some echo signals are measured using a rephasing gradient magnetic field of a lower order (zero order, that is, a case where no rephasing gradient magnetic field is applied is also included) than the predetermined order or a rephasing gradient magnetic field for asymmetric measurement as an example of the rephasing gradient magnetic field of a smaller amount of application than the rephasing gradient magnetic field of the predetermined order.

First Example

Next, a first example of the MRI apparatus and the gradient magnetic field application method of the present invention will be described. In this example, when the application of a rephasing gradient magnetic field waveform of the predetermined order based on the GMN method is difficult with the imaging parameter setting value (that is, imaging conditions) that the operator wants, a rephasing gradient magnetic field waveform of a lower order than the predetermined order is calculated and at least some echo signals are measured using this calculated rephasing gradient magnetic field waveform. That is, the rephasing order is lowered when it is difficult to perform rephasing of the predetermined order on the basis of the GMN method. Although this example is an example suitable for the calculation of a rephasing gradient magnetic field waveform in the slice direction and the frequency encoding direction, a rephasing gradient magnetic field waveform in the phase encoding direction may also be calculated in the same idea. Hereinafter, this example will be described in detail on the basis of FIG. 8.

FIG. 8(a) is a flow chart showing the operation flow of this example. This operation flow shows a case, in which the predetermined order is set to the second order, as an example in which rephasing of the predetermined order is tried first and rephasing of a lower order than the predetermined order is tried when the rephasing of the predetermined order cannot be performed. In addition, this example may start from third-order or more rephasing without being limited to the second order. This operation flow is stored in advance as a program in a storage unit, such as a magnetic disk, and is executed when an arithmetic processing unit reads the program into the memory to execute it when necessary. Hereinafter, each step in FIG. 8(a) will be described in detail.

In step 801, the arithmetic processing unit calculates a rephasing gradient magnetic field waveform of a predetermined order (here, second order) for one axis under the desired imaging parameter setting value input by the operator through the display and operation unit 113. As an example of the imaging parameter, there is a repetition time (TR) or an echo time (TE) of a pulse sequence. When the operator sets and inputs these values through the display and operation unit 113, the arithmetic processing unit calculates a second-order rephasing gradient magnetic field waveform in one direction with the imaging parameter setting value, such as the TR or the TE set as input, as the conditions. Details of the calculation method are the same as described above.

In step 802, the arithmetic processing unit determines whether or not it is possible to apply the rephasing gradient magnetic field waveform of the predetermined order (here, second order) calculated in step 801.

For example, when a rephasing gradient magnetic field waveform is not calculated because a sufficient time for application of the rephasing gradient magnetic field cannot be secured with the imaging parameter value set as input, it is not possible to apply the rephasing gradient magnetic field waveform of this predetermined order. Specifically, as shown in an example of FIG. 8(b), when a rephasing gradient magnetic field applied in the frequency encoding direction (Gf) is superimposed on a slice selection gradient magnetic field applied in the slice direction (Gs), that is, when Tb is located at the left side of Ta in the drawing or when a rephasing gradient magnetic field applied in the slice direction (Gs) is superimposed on a read gradient magnetic field applied in the frequency encoding direction (Gf), that is, when Tc is located at the right side of Td in the drawing, it is not possible to apply the rephasing gradient magnetic field waveform of this predetermined order.

Alternatively, when the maximum value of the calculated rephasing gradient magnetic field waveform exceeds an upper limit of a gradient magnetic field which can be generated by a gradient magnetic field generator or when the temporal change rate (dB/dt) of the rephasing gradient magnetic field waveform exceeds the slew rate of the apparatus or a predetermined upper limit which is allowable in the object, it is not possible to apply the rephasing gradient magnetic field waveform of this predetermined order. The arithmetic processing unit compares the rephasing gradient magnetic field waveform calculated in step 801 with the upper limit or the limit, and determines that the rephasing gradient magnetic field waveform of the predetermined order cannot be applied if it exceeds at least one of them.

As a result of the above determination, when it is determined that the application is not possible (No), the process proceeds to step 803. On the other hand, when the rephasing gradient magnetic field waveform calculated in step 801 exceeds neither the upper limit nor the limit, it is determined that the application is possible (Yes). Then, imaging based on the pulse sequence using the calculated second-order rephasing gradient magnetic field waveform is performed by the measurement control unit 111.

In step 803, the arithmetic processing unit calculates a rephasing gradient magnetic field waveform of a lower order (here, first order) than the predetermined order for one direction under the desired imaging parameter setting value input by the operator through the display and operation unit 113. Details of the calculation method are the same as described above.

In step 804, the arithmetic processing unit determines whether or not it is possible to apply the rephasing gradient magnetic field waveform of the lower order (here, first order) than the predetermined order calculated in step 803. Since a determination method is the same as that in step 802, detailed explanation thereof will be omitted. When it is determined that the application is not possible (No), the process proceeds to step 805. When it is determined that the application is possible (Yes), imaging based on the pulse sequence using the calculated first-order rephasing gradient magnetic field waveform is performed by the measurement control unit 111.

Figure 13:
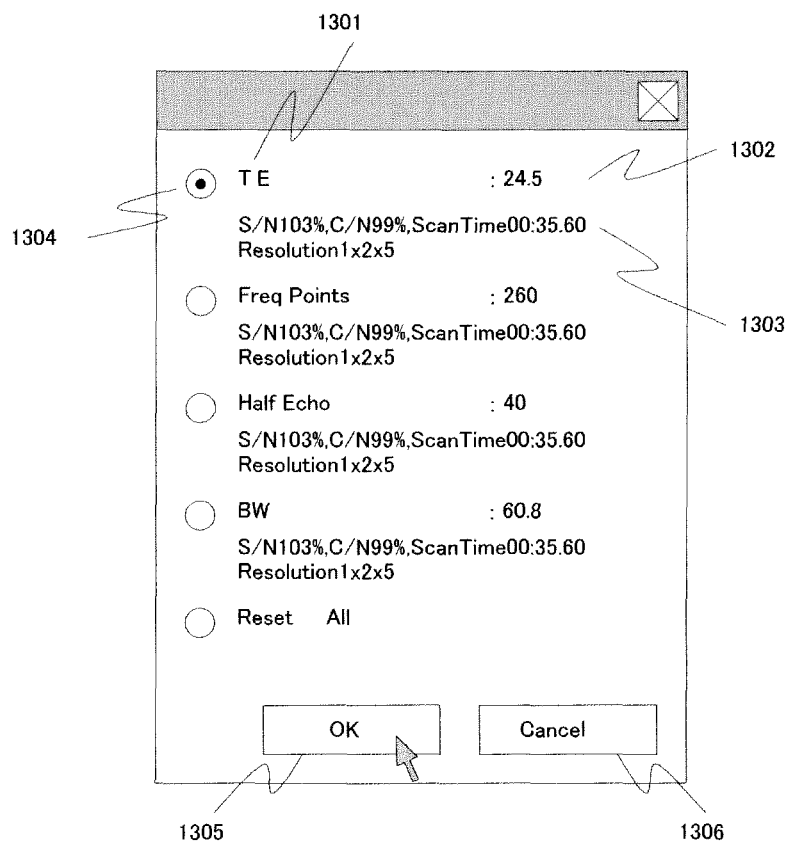
FIG. 13 is a view showing a window presenting the change of an imaging parameter.

In step 805, the arithmetic processing unit notifies the operator that it is not possible to apply the rephasing gradient magnetic field pulse in the calculated direction (for example, displays a message on a display of the display and operation unit 113) under the desired input imaging parameter setting value. In this case, as shown in FIG. 13, it is also possible to display a window showing imaging parameters which may be changed so that the rephasing gradient magnetic field can be applied. In the window shown in FIG. 13, there are an imaging parameter name (1301) and its value (1302), imaging time or information showing numerically the influence on an image when changed (1303), a button (1304) for selecting a parameter, a button (1305) for applying a change, and a cancel button (1306) for undoing the change.

The above is an operation flow for calculating the rephasing gradient magnetic field waveform for one direction. In the case of calculating each rephasing gradient magnetic field waveform in plural directions, it is preferable to repeat the above-described processing flow for each of the directions and to calculate a rephasing gradient magnetic field waveform suitable for the conditions unique to the direction. In this case, as described above, the calculation in the slice direction and the frequency encoding direction is performed taking into consideration that the application pattern of the rephasing gradient magnetic field waveform is an opposite direction in time.

In the phase encoding direction, the rephasing gradient magnetic field may be applied only in a predetermined range of phase encoding, as will be described in a third example.

Until now, the operation flow of this example has been described.

As described above, according to the MRI apparatus and the gradient magnetic field application method of this example, the rephasing gradient magnetic field waveform of the possible order is calculated according to the imaging parameter setting value that the operator wants, within the restrictions on the hardware of the MRI apparatus and the object. As a result, it is possible to obtain the rephasing effect based on the GMN method while reducing the load on the hardware of the MRI apparatus and the object.

Second Example

Next, a second example of the MRI apparatus and the gradient magnetic field application method of the present invention will be described. In this example, a rephasing gradient magnetic field waveform for performing asymmetric measurement is calculated in addition to the rephasing gradient magnetic field waveform whose order has lowered in the first example described above, and it is determined whether or not this application is possible. That is, as a best alternative plan when the application of the rephasing gradient magnetic field of the predetermined order is difficult with the imaging parameter setting value (that is, imaging conditions) that the operator wants, not only the rephasing gradient magnetic field waveform whose order has lowered in the first example described above but also the rephasing gradient magnetic field waveform for asymmetric measurement is calculated, and the echo signal is measured using the possible rephasing gradient magnetic field waveform. This example is an example suitable for the calculation of a rephasing gradient magnetic field waveform in the frequency encoding direction.

First, asymmetric measurement and a rephasing gradient magnetic field waveform for asymmetric measurement will be described. In normal symmetric measurement, symmetrical echo data is acquired by sampling the first half and the second half of an echo signal symmetrically with its peak position as the center. In contrast, in asymmetric measurement, the first half is sampled less (shorter) than the second half with the peak position of an echo signal as a reference. That is, in the entire sampling window of the echo signal, the peak position of the echo signal shifts to the first half. In particular, measurement for sampling mainly the second half by reducing the first half of an echo signal as much as possible is also called half echo measurement. In this asymmetric measurement, since the bandwidth can be narrowed by reducing the application strength of the read gradient magnetic field of an echo signal, it is possible to increase the SN of the echo signal and the image. In particular, in the asymmetric measurement, the amount of application of the read gradient magnetic field for measuring the first half of an echo signal (area surrounded by the gradient magnetic field waveform and the time axis) can be reduced. As a result, the application strength and/or the application time of a rephasing gradient magnetic field can be reduced compared with those in the case of symmetric measurement. In addition, since the sampling time of the first half of the echo signal can be shortened, it is possible to secure the longer duration in which the rephasing gradient magnetic field can be inserted. Therefore, in this example, when it is determined that it is not possible to apply a rephasing gradient magnetic field waveform for symmetric measurement, a rephasing gradient magnetic field waveform for asymmetric measurement is calculated. Then, it is determined whether or not this rephasing gradient magnetic field waveform for asymmetric measurement can be applied. If it is possible to apply the rephasing gradient magnetic field waveform for asymmetric measurement, asymmetric measurement using the calculated rephasing gradient magnetic field waveform is performed.

Figure 4:
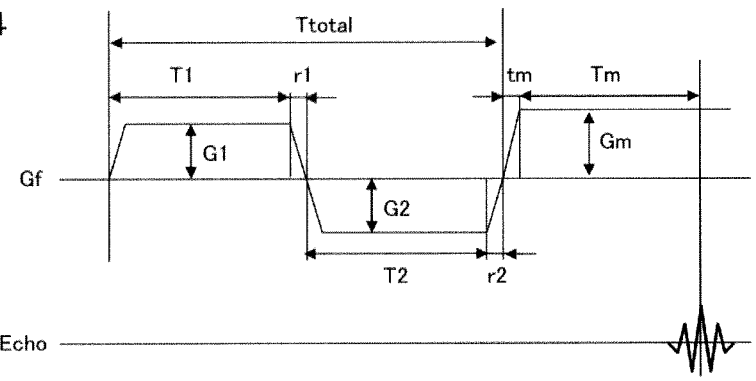
FIG. 4 is a timing chart showing an application pattern of the first-order rephasing gradient magnetic field in the frequency encoding direction.

In order to calculate the rephasing gradient magnetic field waveform for asymmetric measurement, a longer time for which the rephasing gradient magnetic field waveform is to be applied is secured by shortening Tm in FIG. 2 in the case of second-order rephasing and shortening Tm in FIG. 4 in the case of first-order rephasing. In addition, since Tm becomes short, the amount of application of the read gradient magnetic field for sampling the first half of an echo signal is reduced. As a result, the application strength and/or the application time of the rephasing gradient magnetic field are reduced. In order to calculate the rephasing gradient magnetic field waveform specifically, each gradient magnetic field pulse included in the rephasing gradient magnetic field waveform is calculated using Tm for asymmetric measurement in the above Expression (16) in the case of second-order rephasing or the above Expressions (26) and (28) in the case of first-order rephasing.

Figure 8:
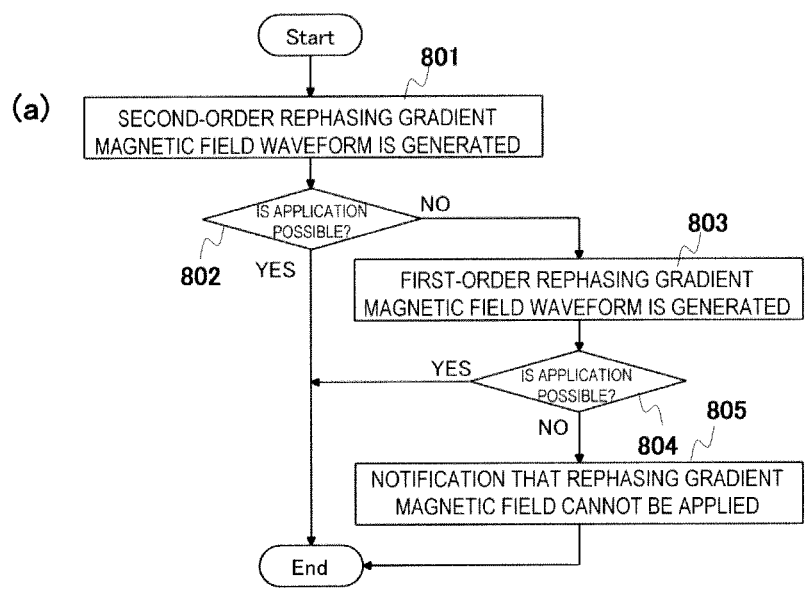
FIG. 8(a) is a flow chart showing the operation flow in a first example.
FIG. 8(b) is a timing chart showing the application timing restrictions on the rephasing gradient magnetic field.
Figure 8:
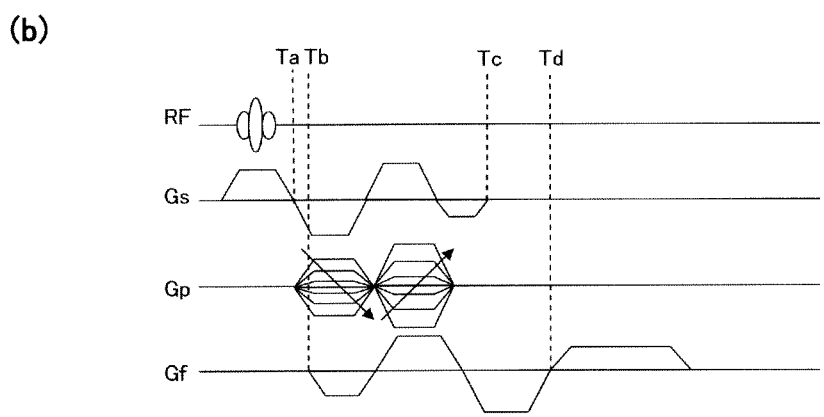
Figure 9:
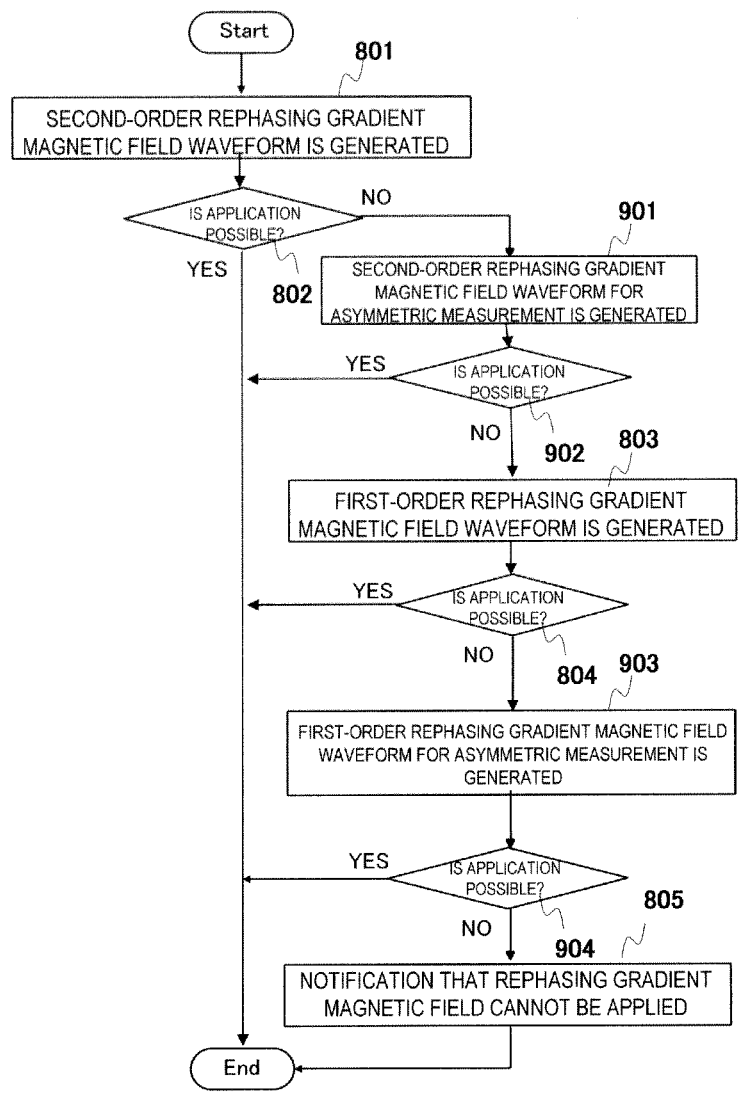
FIG. 9 is a flow chart showing the operation flow in a second example.

Next, this example will be described in detail on the basis of FIG. 9. FIG. 9 is a flow chart showing the operation flow of this example. In this operation flow, processing steps related to this example are further added to the flow chart of FIG. 8 showing the operation flow of the first example described above. Reference numerals of 800s are given to the same processing steps, and reference numerals of 900s are given to processing steps unique to this example. Hereinafter, only the added processing steps unique to this example will be described in detail, and explanation regarding the same processing steps as in FIG. 8 will be omitted.

In step 901, the arithmetic processing unit calculates a second-order rephasing gradient magnetic field waveform for asymmetric measurement since it is determined in step 802 that the second-order rephasing gradient magnetic field waveform for symmetric measurement calculated in step 801 cannot be applied (No). The specific calculation method is the same as described above.

In step 902, the arithmetic processing unit determines whether or not it is possible to apply the second-order rephasing gradient magnetic field waveform for asymmetric measurement calculated in step 901. Since the specific content of the determination processing is the same as in step 802, explanation thereof will be omitted. When it is determined that the application is not possible (No), the process proceeds to step 803 to calculate the first-order rephasing gradient magnetic field waveform for symmetric measurement. When it is determined that the application is possible (Yes), asymmetric measurement based on the pulse sequence using this calculated second-order rephasing gradient magnetic field waveform for asymmetric measurement is executed by the measurement control unit 111.

In step 903, the arithmetic processing unit calculates a first-order rephasing gradient magnetic field waveform for asymmetric measurement since it is determined in step 804 that the first-order rephasing gradient magnetic field waveform for symmetric measurement calculated in step 803 cannot be applied (No). The specific calculation method is the same as described above.

In step 904, the arithmetic processing unit determines whether or not it is possible to apply the first-order rephasing gradient magnetic field waveform for asymmetric measurement calculated in step 903. Since the specific content of the determination processing is the same as in step 804, explanation thereof will be omitted.

When it is determined that the application is not possible (No), the process proceeds to step 805. In step 805, the arithmetic processing unit notifies the operator that it is not possible to apply the rephasing gradient magnetic field pulse in the calculated direction under the desired input imaging parameter setting value. In this case, in the same manner as in the first example, it is also possible to display a window showing imaging parameters which may be changed so that the rephasing gradient magnetic field can be applied, as shown in FIG. 13.

When it is determined that the application is possible (Yes), asymmetric measurement based on the pulse sequence using the calculated first-order rephasing gradient magnetic field waveform for asymmetric measurement is executed by the measurement control unit 111.

Until now, the operation flow of this example has been described. Moreover, in the above explanation regarding the operation flow, an example is shown in which the second-order rephasing gradient magnetic field waveform for asymmetric measurement is first calculated when it is not possible to apply the second-order rephasing gradient magnetic field waveform for symmetric measurement. However, when it is not possible to apply the second-order rephasing gradient magnetic field waveform for symmetric measurement, the first-order rephasing gradient magnetic field waveform for symmetric measurement may be first calculated. Then, if it is not possible to apply the first-order rephasing gradient magnetic field waveform for symmetric measurement, the second-order rephasing gradient magnetic field waveform for asymmetric measurement may be calculated and then it may be determined whether or not the second-order rephasing gradient magnetic field waveform for asymmetric measurement can be applied. That is, in the operation flow shown in FIG. 9, steps 901 and 803 may be exchanged.

As described above, according to the MRI apparatus and the gradient magnetic field application method of this example, the rephasing gradient magnetic field waveform of the possible order can be calculated according to the imaging parameter setting value that the operator wants, within the restrictions on the hardware of the MRI apparatus and the object, more accurately than in the case of the first example described above.

Third Example

Next, a third example of the MRI apparatus and the gradient magnetic field application method of the present invention will be described. In this example, the order of a rephasing gradient magnetic field applied in the phase encoding direction is controlled according to phase encoding. Specifically, when the maximum value of the rephasing gradient magnetic field waveform exceeds the maximum gradient magnetic field strength that can be applied by the gradient magnetic field generator, the order of the rephasing gradient magnetic field is lowered. Alternatively, the rephasing gradient magnetic field is applied only in the desired phase encoding range.

Assuming that the maximum gradient magnetic field strength that can be applied as a rephasing gradient magnetic field in the MRI apparatus is $G_{max}$, the relationship of $G \leq G_{max}$ should be satisfied between the maximum gradient magnetic field strength $G_{max}$ and the gradient magnetic field G in the phase encoding direction calculated by Expression (38). In other words, assuming the maximum amount of phase encoding by which the rephasing gradient magnetic field can be applied is $A_{max}$, $A_{max}$ is expressed as follows.

$$A_{max} = G_{max} \cdot Ta(1-2\alpha) \quad (39)$$

In phase encoding with the amount of phase encoding equal to or larger than this $A_{max}$, it is not possible to apply the rephasing gradient magnetic field unless the imaging parameter setting value is changed.

In addition, in zero or near-zero phase encoding, the amount of phase encoding is also small. Accordingly, the phase change of the spins based on the movement or motion is also small. Therefore, it is not necessary to apply a rephasing gradient magnetic field in particular.

Then, assuming that the amount of phase encoding showing the upper limit of the application range of the rephasing gradient magnetic field in the phase encoding direction is $A_{up}$ and the amount of phase encoding showing the lower limit is $A_{low}$, they can be applied as follows.

(a) Only the $A_{up}$ is set as the imaging conditions, and a rephasing gradient magnetic field is applied in a phase encoding range with the amount of phase encoding equal to or smaller than $A_{up}$. That is, no rephasing gradient magnetic field is applied in a high frequency region in the phase encoding direction, and the rephasing gradient magnetic field is applied only in a low frequency region. Moreover, on the contrary, only the $A_{low}$ may be set, and the rephasing gradient magnetic field may be applied in a phase encoding range with the amount of phase encoding equal to or longer than $A_{low}$. That is, it is not necessary to apply a rephasing gradient magnetic field near the origin in the phase encoding direction.

(b) $A_{up}$ and $A_{low}$ are set as the imaging conditions, and the rephasing gradient magnetic field is applied in a phase encoding range with the amount of phase encoding satisfying $A_{low} \leq A \leq A_{up}$. That is, no rephasing gradient magnetic field is applied in a high frequency region and a region near the origin in the phase encoding direction.

(c) $A_{up}$ and $A_{low}$ are not set as the imaging conditions, and the rephasing gradient magnetic field is applied in a phase encoding range with the amount of phase encoding equal to or smaller than $A_{max}$.

By making it possible to set as imaging conditions the application range of the rephasing gradient magnetic field using such $A_{up}$ and $A_{low}$ and (a) to (c) described above, the operator can perform application control of the rephasing gradient magnetic field according to phase encoding in the phase encoding direction. Alternatively, the arithmetic processing unit may set automatically the application range on the basis of the imaging conditions. In addition, in all cases of (a) to (c), the normal phase encoding gradient magnetic field without a rephasing gradient magnetic field is applied in phase encoding outside the application range of the rephasing gradient magnetic field.

Figure 10:
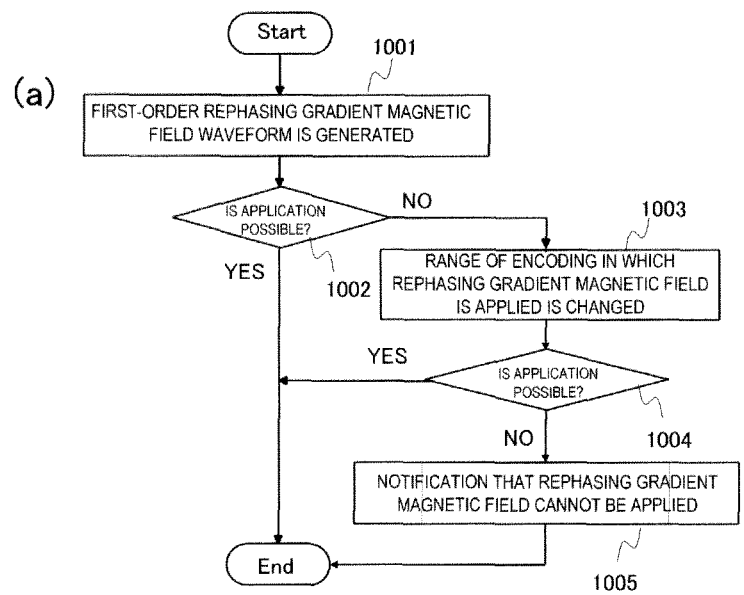
FIG. 10(a) is a flow chart showing the operation flow in a third example.
FIG. 10(b) is a timing chart showing the pulse sequence in which the rephasing gradient magnetic field is applied only for phase encoding in a low spatial frequency region, where the upper drawing is a phase encoding waveform of a high spatial frequency component and the lower drawing is a phase encoding waveform in which the rephasing gradient magnetic field of a low spatial frequency component is added.
Figure 10:
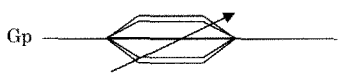
Figure 10:

Next, an operation flow of this example described above will be described on the basis of FIG. 10. In addition, it is assumed that the $A_{up}$ and $A_{low}$ are set in advance by the operator.

In step 1001, the arithmetic processing unit calculates a rephasing gradient magnetic field waveform of a predetermined order (here, first order) in the phase encoding direction on the basis of the imaging parameter setting value, that is, the imaging conditions. Since the specific calculation method is the same as described above, the detailed explanation will be omitted.

In step 1002, the arithmetic processing unit determines whether or not it is possible to apply the rephasing gradient magnetic field waveform in the phase encoding direction calculated in step 1001. The determination in this step is a determination regarding whether the application strength of the rephasing gradient magnetic field in the phase encoding direction calculated on the basis of Expression (38) under the imaging conditions or the application strength or dB/dt superimposed on a gradient magnetic field on the other axis in the case of oblique imaging may exceed the upper limit or the predetermined limit of the gradient magnetic field generator. When it is determined that the application is not possible (No) since it exceeds the upper limit or the predetermined limit, the process proceeds to step 1003. When it is determined that the application is possible (Yes), imaging in which the calculated rephasing gradient magnetic field waveform is applied in the phase encoding direction is performed by the measurement control unit 111.

In step 1003, the arithmetic processing unit sets a range of phase encoding in which the rephasing gradient magnetic field is to be applied. Specifically, as described above, $A_{max}$ is compared with $A_{up}$ and $A_{low}$ set as input in advance in order to control the application of a rephasing gradient magnetic field for each phase encoding. When $A_{max}$ is larger than $A_{up}$ in the case of (a), when $A_{max}$ is larger than $A_{up}$ or when $A_{max}$ is smaller than $A_{low}$, in the case of (b), and in a range of the amount of phase encoding exceeding $A_{max}$ in the case of (c), it is determined that the application is not possible (No). When it is determined that the application is not possible (No), the process proceeds to step 1004. In a range of phase encoding equal to or smaller than $A_{up}$ in the case of (a), in a range of phase encoding satisfying $A_{low} \leq A \leq A_{up}$ in the case of (b), and in a range of phase encoding equal to or smaller than $A_{max}$ in the case of (c), it is determined that the application is possible (Yes). In each case, imaging in which the rephasing gradient magnetic field is applied is performed by the measurement control unit 111.

In step 1004, the arithmetic processing unit notifies the operator that it is not possible to apply the rephasing gradient magnetic field waveform in the phase encoding direction (for example, displays a message on a display of the display and operation unit 113) under the desired input imaging parameter setting value. In this case, in the same manner as in the first example, it is also possible to display a window showing imaging parameters which may be changed so that the rephasing gradient magnetic field can be applied, as shown in FIG. 13.

In addition, although the rephasing gradient magnetic field waveform in the phase encoding direction has been described in the above operation flow, a rephasing gradient magnetic field waveform in the slice encoding direction can also be calculated similarly.

As described above, according to the MRI apparatus and the gradient magnetic field application method of this example, also in the phase encoding direction or the slice encoding direction, the rephasing gradient magnetic field waveform of the possible order corresponding to the phase encoding and/or slice encoding can be calculated according to the imaging parameter setting value that the operator wants, within the restrictions on the hardware of the MRI apparatus and the object.

Fourth Example

Next, a fourth example of the MRI apparatus and the gradient magnetic field application method of the present invention will be described. In this example, the order and measurement method of the rephasing gradient magnetic field are controlled on the basis of the priority set by the operator. Specifically, when the operator gives priority to the rephasing effect, a rephasing gradient magnetic field waveform is calculated so that a high-order rephasing gradient magnetic field is applied if possible. On the other hand, when the operator gives priority to the image quality (for example, SN), the measurement method is controlled so that the image quality is improved by making the bandwidth for measuring an echo signal as narrow as possible. For this reason, this example is particularly suitable for calculation of a rephasing gradient magnetic field waveform in the frequency encoding direction.

First, a rephasing gradient magnetic field when priority given to the rephasing effect will be described. In order to insert the rephasing gradient magnetic field in time between the slice selection gradient magnetic field and the read gradient magnetic field, the time width needs to be sufficiently long so that the maximum strength of the rephasing gradient magnetic field waveform becomes equal to or smaller than the predetermined upper limit or the predetermined limit. However, the rephasing gradient magnetic field may not be inserted since the time width becomes narrow by setting of the operator, for example, TR/TE or the bandwidth at the time of echo signal measurement. In such a case, a large time width in which the rephasing gradient magnetic field can be inserted is secured by shortening the echo signal read period as much as possible so that the rephasing gradient magnetic field can be inserted. In this case, since the bandwidth increases, the SN of an image is reduced. For example, when imaging a blood vessel with a fast flow rate, it is preferable to give priority to rephasing since a flow artifact is easily caused.

Next, a rephasing gradient magnetic field when priority given to the image quality will be described. In order to improve the image quality (especially, SN), the bandwidth at the time of echo signal measurement is narrowed. In order to do so, a sampling period for which an echo signal is measured is increased to reduce the application strength of the read gradient magnetic field. However, if the sampling period is increased in symmetric measurement of an echo signal, the time width in which the rephasing gradient magnetic field can be inserted becomes narrow. This increases a possibility that the rephasing gradient magnetic field will not be inserted. Therefore, asymmetric measurement of the echo signal is performed to shorten a period for which the first half of the echo signal is sampled as much as possible, so that the large time width in which the rephasing gradient magnetic field can be inserted is secured. In addition, it is possible to narrow the bandwidth and also to reduce the application strength of the read gradient magnetic field by performing asymmetric measurement. That is, inserting the rephasing gradient magnetic field and improving the image quality become compatible by performing asymmetric measurement. For example, when imaging a blood vessel with a slow flow rate, it is preferable to give priority to the image quality since a flow artifact is difficult to be caused.

Figure 11:
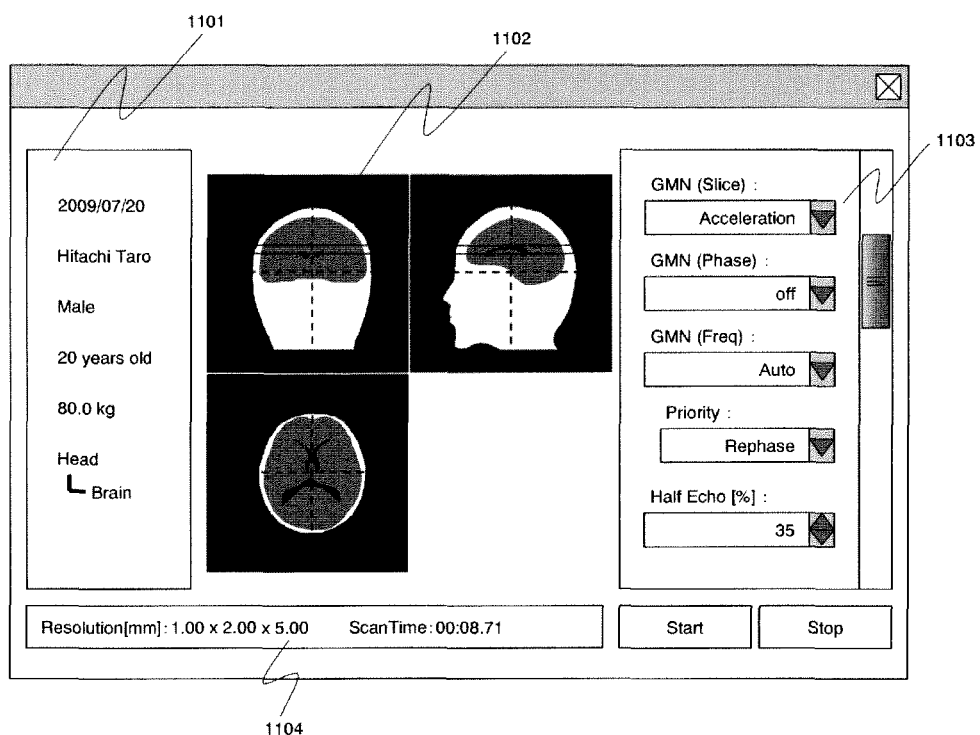
FIG. 11 is a view showing a GUI operated by a user to perform imaging.

FIG. 11 shows an example of a user interface for an operator to set the above-described rephasing priority or image quality priority. An 1101 portion is a region where object information is displayed, an 1102 portion is a region where a captured image is displayed, 1103 is a region for inputting and setting various imaging conditions, and 1104 indicates a time of imaging performed on the basis of the imaging conditions set in the 1103 and the like and the spatial resolution of an acquired image. In the imaging condition setting portion 1103, for example, a menu for setting the application conditions of a rephasing gradient magnetic field (GMN pulse) in a slice direction (GMN (Slice)), a phase encoding direction (GMN (Phase)), and a frequency encoding direction (GMN (Freq)), a menu for setting the priority (Priority), and a menu for setting the sampling rate of asymmetric measurement (Half Echo) are prepared.

Here, in the menu for setting the application conditions of a rephasing gradient magnetic field in each direction, one of [Acceleration] (rephasing up to the second order), [Velocity] (rephasing up to the first order), [Auto] (Automatic setting of the rephasing order), and Off (no rephasing gradient magnetic field is applied) can be selected separately in each direction. In the setting of [Acceleration] and [Velocity], a rephasing gradient magnetic field waveform of the set order is calculated. Then, if it is not possible to apply the rephasing gradient magnetic field waveform of the set order, the point is notified. In the setting of [Auto], a rephasing gradient magnetic field waveform of the possible order is calculated according to the imaging parameter setting value that the operator wants, within the restrictions on the hardware of the MRI apparatus and the object, in each example described above.

Moreover, in the menu for setting the priority (Priority), one of [Rephase] (rephasing effect priority), [Acq. Time] (image quality priority), and [Auto](automatic determination of [Rephase] or [Acq Time] from the object information) can be selected in this example. In particular, for the [Auto], the priority (Priority) is prepared in advance in a state stored in a storage unit, such as a magnetic disk, so as to match the attribute information, such as age and sex of an object to be imaged or an object, and the priority (Priority) is determined on the basis of the correspondence information prepared in advance. For example, when imaging the head MRA, the flow speed of the internal carotid artery is reduced in proportional to the age of the object. Accordingly, [Rephase] is set the priority (Priority) if the object is less than 60 years old and [Acq Time] is set if the object is 60 years old or more, and subsequent rephasing gradient magnetic field generation processing is performed by setting the priority (Priority) according to the age. Details of the processing of generating a rephasing gradient magnetic field waveform ill be described in detail later.

In addition, the sampling rate is an extra sampling rate (β) for ½ of the entire echo signal, and means sampling of only ½ echo (that is, only the second half of an echo signal) in the case of β=0% and means symmetric measurement for sampling the entire echo signal in the case of β=100%.

Figure 12:
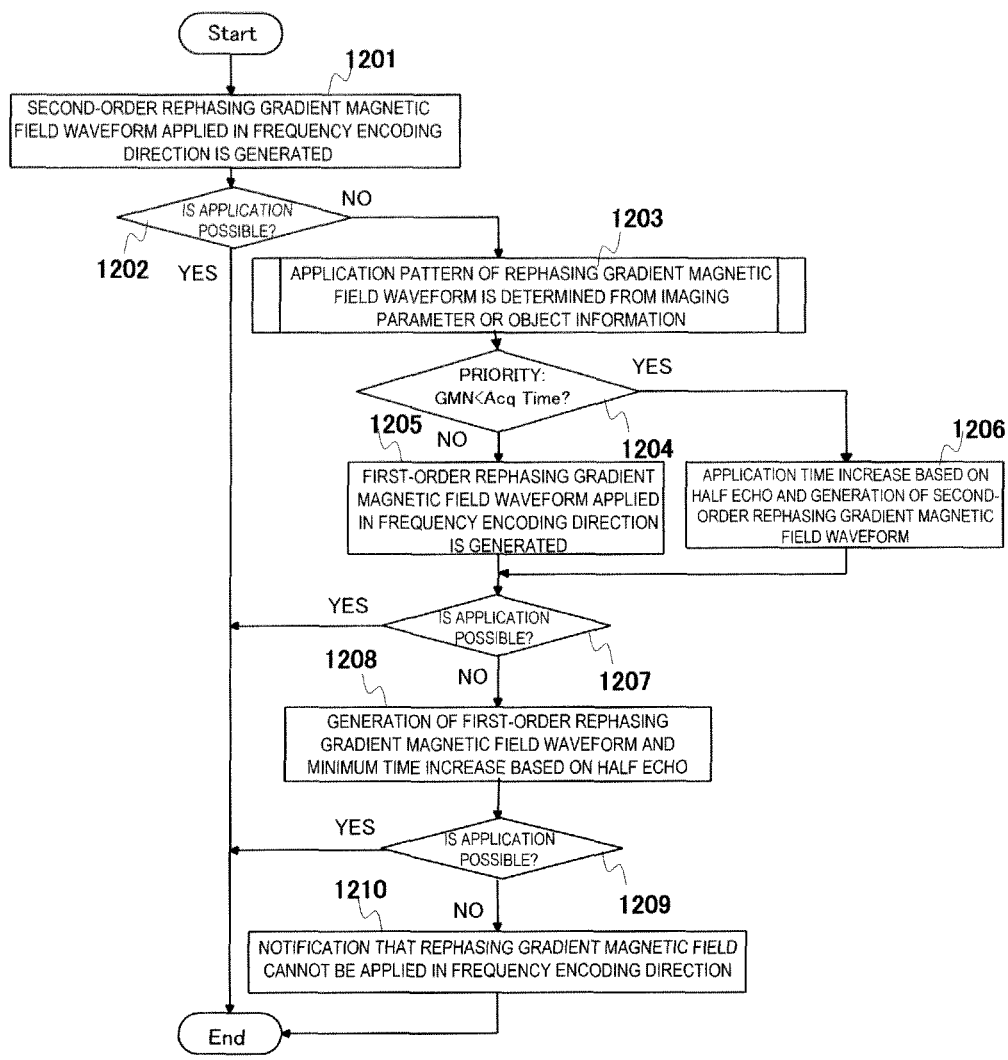
FIG. 12 is a flow chart showing the operation flow in a fourth example.

Next, FIG. 12 is a flow chart showing the operation flow of this example shown in FIG. 12. Hereinafter, each step will be described in detail.

In step 1201, the arithmetic processing unit calculates a second-order rephasing gradient magnetic field waveform applied in the frequency encoding direction. Since this processing step is the same as the above-described step 801, detailed explanation thereof will be omitted.

In step 1202, the arithmetic processing unit determines whether or not it is possible to apply the second-order rephasing gradient magnetic field waveform calculated in step 1201. Since this processing step is the same as the above-described step 802, detailed explanation thereof will be omitted. When it is determined that the application is not possible (No), the process proceeds to step 1203. When it is determined that the application is possible (Yes), the calculated second-order rephasing gradient magnetic field waveform is applied in the frequency encoding direction so that imaging is performed.

When [Auto] is selected in the menu for setting the priority (Priority) of FIG. 11 in step 1203, the arithmetic processing unit determines the priority (Priority) from the attribution information of the object to be imaged or the object attribution information on the basis of the correspondence between the priority (Priority) and the attribution information of the object to be imaged or the object attribution information stored in advance in the storage unit. When [Rephase] or [Acq Time] is selected, priority is given to the selected one and the process proceeds to step 1204.

In step 1204, the arithmetic processing unit determines whether the determination result in step 1203 is rephasing priority (Rephase>Acq Time) or image quality priority (Rephase<Acq Time). In the case of rephasing priority (Rephase), the process proceeds to step 1205. In the case of image quality priority (Acq Time), the process proceeds to step 1206.

In the case of rephasing priority, the arithmetic processing unit changes the order of rephasing from the second order to the first order to calculate the first-order rephasing gradient magnetic field waveform in step 1205. Then, the maximum application strength of the rephasing gradient magnetic field waveform is reduced so as to fit the predetermined upper limit or the predetermined limit. In addition, the total application time is shortened by reducing the number of rephasing gradient magnetic field pulses, so that the rephasing gradient magnetic field waveform fits in time in which the waveform can be inserted (spare time between the slice selection gradient magnetic field and the read gradient magnetic field), which is determined by the set imaging conditions.

In the case of image quality priority, the arithmetic processing unit calculates a second-order rephasing gradient magnetic field in asymmetric measurement in step 1206. In order to do so, the arithmetic processing unit calculates a second-order rephasing gradient magnetic field waveform in a state where the time width, for which the rephasing gradient magnetic field can be applied, is increased by shortening Tm in FIG. 2 as described above. Since details of the method of calculating the second-order rephasing gradient magnetic field waveform in asymmetric measurement are the same as described above, detailed explanation thereof will be omitted.

In step 1207, the arithmetic processing unit determines whether or not it is possible to apply the first-order rephasing gradient magnetic field waveform calculated in step 1205 or the second-order rephasing gradient magnetic field waveform in the asymmetric measurement calculated in step 1206. Since this processing step is the same as the above-described step 902 or step 804, detailed explanation thereof will be omitted. When it is determined that the application is not possible (No), the process proceeds to step 1208. When it is determined that the application is possible (Yes), the calculated rephasing gradient magnetic field waveform is applied in the frequency encoding direction so that imaging is performed.

In step 1208, the arithmetic processing unit calculates a first-order rephasing gradient magnetic field waveform for asymmetric measurement. Since this processing step is the same as the above-described step 903, detailed explanation thereof will be omitted.

In step 1209, the arithmetic processing unit determines whether or not it is possible to apply the first-order rephasing gradient magnetic field waveform for asymmetric measurement calculated in step 1208. Since the specific content of the determination processing is the same as in step 904, the explanation will be omitted. When it is determined that the application is not possible (No), the process proceeds to step 1210. In step 1210, the arithmetic processing unit notifies the operator that it is not possible to apply the rephasing gradient magnetic field pulse in the frequency encoding direction under the desired input imaging parameter setting value. When it is determined that the application is possible (Yes), asymmetric measurement is executed by applying the calculated first-order rephasing gradient magnetic field waveform for asymmetric measurement in the frequency encoding direction.

The above is an explanation of the operation flow in this example.

As described above, according to the MRI apparatus and the gradient magnetic field application method of this example, an image with the appropriate rephasing effect or image quality can be acquired according to the desired priority of the operator or according to the attribution information of the object to be imaged or the object attribution information.

REFERENCE SIGNS LIST

101: object
102: static magnetic field generation magnet
103: gradient magnetic field coil
104: transmission RF coil
105: receiving RF coil
106: signal detection unit
107: signal processing unit
108: overall control unit
109: gradient magnetic field power source
110: RF transmission unit
111: measurement control unit
112: bed
113: display and operation unit

The invention claimed is:

1. A magnetic resonance imaging apparatus comprising:
a gradient magnetic field generator that generates a gradient magnetic field;
an arithmetic processing unit that calculates a rephasing gradient magnetic field based on a gradient moment nulling (GMN) method;
a measurement control unit that controls measurement of echo signals from an object by applying the rephasing gradient magnetic field to the object; and
an input/output unit that displays a value of an imaging parameter and also receives inputting and setting of the imaging parameter value,
wherein the arithmetic processing unit calculates a rephasing gradient magnetic field of a smaller amount of application than a rephasing gradient magnetic field of a predetermined order according to the imaging parameter value set as input, and
the measurement control unit measures at least some echo signals using the rephasing gradient magnetic field of the smaller amount of application than the rephasing gradient magnetic field of the predetermined order.

2. The magnetic resonance imaging apparatus according to claim 1,
wherein the arithmetic processing unit calculates a rephasing gradient magnetic field of a smaller amount of application than the rephasing gradient magnetic field of the predetermined order in at least one direction of a slice direction, a frequency encoding direction, and a phase encoding direction.

3. The magnetic resonance imaging apparatus according to claim 2,
wherein the arithmetic processing unit recognizes difficulty to apply the rephasing gradient magnetic field of the predetermined order with the imaging parameter value set as input (a) when a maximum strength of the rephasing gradient magnetic field exceeds a maximum gradient magnetic field strength which can be generated by the gradient magnetic field generator, or (b) when a time change (dB/dt) of the rephrasing gradient magnetic field exceeds an upper limit allowable in the detection, and calculates a rephasing gradient magnetic field of a lower order than the predetermined order.

4. The magnetic resonance imaging apparatus according to claim 3,
wherein the arithmetic processing unit displays on the input/output unit a recommended value of the imaging parameter, which enables application, when the arithmetic processing unit recognizes the difficulty.

5. The magnetic resonance imaging apparatus according to claim 1,
wherein the arithmetic processing unit recognizes difficulty to apply the rephrasing gradient magnetic field of the predetermined order with the imaging parameter value set as input (a) when a maximum strength of the rephrasing gradient magnetic field exceeds a maximum gradient magnetic field strength which can be generated by the gradient magnetic field generator, or (b) when a time change (dB/dt) of the rephrasing gradient magnetic field exceeds an upper limit allowable in the detection, and calculates a rephasing gradient magnetic field for asymmetric measurement, and
the measurement control unit controls measurement of the echo signals using the rephasing gradient magnetic field for asymmetric measurement.

6. The magnetic resonance imaging apparatus according to claim 5,
wherein the arithmetic processing unit calculates a rephasing gradient magnetic field for asymmetric measurement of a lower order than the predetermined order when the arithmetic processing unit recognized the difficulty.

7. The magnetic resonance aging apparatus according to claim 1,
wherein the arithmetic processing unit controls the order of a rephasing gradient magnetic field, which is applied in a phase encoding direction, according to phase encoding.

8. The magnetic resonance imaging apparatus according to claim 7,
wherein the arithmetic processing unit sets a range of phase encoding which applies the rephasing gradient magnetic field, and
the measurement control unit applies a rephasing gradient magnetic field only in the set range of phase encoding.

9. The magnetic resonance imaging apparatus according to claim 8,
wherein the input/output unit includes an input/output section of at least one of an upper and a lower limit of the range of phase encoding which applies the rephasing gradient magnetic field, and
the arithmetic processing unit sets the range of phase encoding, which applies the rephasing gradient magnetic field, on the basis of the upper and lower limits set as input.

10. The magnetic resonance imaging apparatus according to claim 1,
wherein the input/output unit includes an input/output section which receives a selection of rephasing priority or S/N (signal to noise) priority, and
the arithmetic processing unit controls the order of the rephasing gradient magnetic field or a measurement method of the echo signals according to the selection.

11. The magnetic resonance imaging apparatus according to claim 10, wherein the arithmetic processing unit calculates a rephasing gradient magnetic field of a lower order than the predetermined order when the rephasing priority is set as input by the input/output unit.

12. The magnetic resonance imaging apparatus according to claim 10,
wherein the arithmetic processing unit calculates a rephasing gradient magnetic field for asymmetric measurement of an order equal to or lower than the predetermined order when the S/N (signal to noise) priority is set as input by the input/output unit.

13. A gradient magnetic field application method of applying a rephasing gradient magnetic field based on a gradient moment nulling (GMN) method in a magnetic resonance imaging apparatus, the method comprising:
an imaging condition setting step of receiving inputting and setting of a value of an imaging parameter;
a rephasing gradient magnetic field calculation step of calculating a rephasing gradient magnetic field of a smaller amount of application than a rephasing gradient magnetic field of a predetermined order according to the imaging parameter value set as input;
a measurement step of measuring at least some echo signals using the rephasing gradient magnetic field of the smaller amount of application than the rephasing gradient magnetic field of the predetermined order; and
a reconstructing step of reconstructing an image of an object or portion of an object using the echo signals measured in the measurement step.

14. The gradient magnetic field application method according to claim 13,
wherein in the rephasing gradient magnetic field calculation step, a rephasing gradient magnetic field of a lower order than the predetermined order is calculated (a) when a maximum strength of the rephrasing gradient magnetic field exceeds a maximum gradient magnetic field strength which can be generated by a gradient magnetic field generator, or (b) when a time change (dB/dt) of the rephrasing gradient magnetic field exceeds an upper limit allowable in the detection.

15. The gradient magnetic field application method according to claim 13,
wherein in the rephasing gradient magnetic field calculation step, a rephasing gradient magnetic field for asymmetric measurement is calculated (a) when a maximum strength of the rephrasing gradient magnetic field exceeds a maximum gradient magnetic field strength which can be generated by a gradient magnetic field generator, or (b) when a time change (dB/dt) of the rephrasing gradient magnetic field exceeds an upper limit allowable in the detection, and
in the measurement step, the echo signals are measured using the rephasing gradient magnetic field for asymmetric measurement.

16. The gradient magnetic field application method according to claim 13,
wherein in the rephasing gradient magnetic field calculation step, a range of phase encoding which applies the rephasing gradient magnetic field is set, and
in the measurement step, a rephasing gradient magnetic field is applied only in the set range of phase encoding.

17. The gradient magnetic field application method according to claim 13,
wherein in the imaging condition setting step, a selection of rephasing priority or S/N (signal to noise) priority is received, and
in the rephasing gradient magnetic field calculation step, a rephasing gradient magnetic field of a lower order than the predetermined order is calculated when the rephasing priority is set as input.

18. The gradient magnetic field application method according to claim 13,
wherein in the imaging condition setting step, a selection of rephasing priority or S/N (signal to noise) priority is received, and in the rephasing gradient magnetic field calculation step, a rephasing gradient magnetic field for asymmetric measurement of an order equal to or lower than the predetermined order is calculated when the image quality priority is set as input.

* * * * *